(12) United States Patent
Yui et al.

(10) Patent No.: US 9,306,089 B2
(45) Date of Patent: Apr. 5, 2016

(54) SOLAR CELL MODULE AND SOLAR GENERATOR

(75) Inventors: Hideomi Yui, Osaka (JP); Hideki Uchida, Osaka (JP); Tsuyoshi Maeda, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 345 days.

(21) Appl. No.: 13/882,790

(22) PCT Filed: Oct. 27, 2011

(86) PCT No.: PCT/JP2011/074864
§ 371 (c)(1),
(2), (4) Date: May 1, 2013

(87) PCT Pub. No.: WO2012/063651
PCT Pub. Date: May 18, 2012

(65) Prior Publication Data
US 2013/0220416 A1    Aug. 29, 2013

(30) Foreign Application Priority Data

Nov. 11, 2010 (JP) ................................. 2010-252967

(51) Int. Cl.
*H01L 31/0232* (2014.01)
*H01L 31/055* (2014.01)
*H01L 31/054* (2014.01)

(52) U.S. Cl.
CPC ........ *H01L 31/02322* (2013.01); *H01L 31/055* (2013.01); *H01L 31/0547* (2014.12); *Y02E 10/52* (2013.01)

(58) Field of Classification Search
CPC ..... H01L 31/00; H01L 31/02; H01L 31/0232; H01L 31/02322; H01L 31/02327; H01L 31/04; H01L 31/054; H01L 31/055
See application file for complete search history.

(56) References Cited

U.S. PATENT DOCUMENTS

| | | | |
|---|---|---|---|
| 2007/0137696 A1* | 6/2007 | Krokoszinski et al. | 136/255 |
| 2009/0229652 A1* | 9/2009 | Mapel et al. | 136/246 |
| 2010/0043880 A1* | 2/2010 | Bhaumik | H01L 31/055 136/257 |
| 2010/0180932 A1* | 7/2010 | Wang | H01L 31/055 136/246 |

FOREIGN PATENT DOCUMENTS

JP    61-136559 U    8/1986

OTHER PUBLICATIONS

Official Communication issued in International Patent Application No. PCT/JP2011/074864, mailed on Dec. 6, 2011.

* cited by examiner

*Primary Examiner* — Christina Chern
(74) *Attorney, Agent, or Firm* — Keating & Bennett, LLP

(57) ABSTRACT

A solar cell module according to the invention includes a solar cell; a light guiding portion including a first fluorescent substance having a faint color and that emits light having low luminosity factor, the light guiding portion absorbing part of light incident from the outside using the first fluorescent substance and transmitting a first light beam emitted from the first fluorescent substance toward the solar cell; and a converter disposed between the light guiding portion and the solar cell, the converter converting the first light beam incident from the light guiding portion into a second light beam to which the solar cell has higher spectral sensitivity than to the first light beam and causing the second light beam to be incident on the solar cell. Thus, when the solar cell module is used as a window, the solar cell module is highly transparent and highly efficiently generates power.

6 Claims, 15 Drawing Sheets

SOLAR CELL MODULE AND SOLAR GENERATOR

TECHNICAL FIELD

The present invention relates to solar cell modules and solar generators.

This application claims the priority of Japanese Patent Application No. 2010-252967, filed Nov. 11, 2010, the content of which is cited herein.

BACKGROUND ART

A solar generator described in PTL 1 is known as a solar generator in which a solar cell is disposed on an end surface of a light-guiding member and that causes light that has propagated through the light-guiding member to be incident on the solar cell so that the solar generator generates power. The solar generator according to PTL 1 is a window-type solar generator including a light-guiding member used as a window. A fluorescent substance is dispersed within the light-guiding member. The light emitted from the fluorescent substance propagates through the light-guiding member and is received by the solar cell so that power is generated.

CITATION LIST

Patent Literature

PTL 1: Japanese Unexamined Utility Model Registration Application Publication No. 61-136559

SUMMARY OF INVENTION

Technical Problem

The efficiency with which a solar cell generates power varies with the wavelength of light incident on the solar cell. Unless a solar cell that has a spectral response appropriate for light emitted from the fluorescent substance is used, the solar cell cannot generate a large amount of power. Since the light-guiding member is used as a window in the solar generator according to PTL 1, for example, a blue fluorescent substance that has a low luminosity factor is included in the light-guiding member. In this case, an amorphous silicon solar cell that has sensitivity to blue is used as the solar cell. The efficiency with which the amorphous silicon solar cell generates power, however, is lower than that with which a compound semiconductor cell, made of a material, such as GaAs, generates power. Thus, the amount of power generated by the amorphous silicon solar cell is limited.

An object of an aspect of the present invention is to provide a solar cell module that highly efficiently generates power and a solar generator including the solar cell module.

Solution to Problem

A solar cell module according to an aspect of the present invention includes a solar cell; a light guiding portion including a first fluorescent substance, the light guiding portion absorbing part of light incident from the outside using the first fluorescent substance and transmitting a first light beam emitted from the first fluorescent substance toward the solar cell; and a converter disposed between the light guiding portion and the solar cell, the converter converting the first light beam incident from the light guiding portion into a second light beam and causing the second light beam to be incident on the solar cell, the solar cell having higher spectral sensitivity to the second light beam than to the first light beam.

The light guiding portion may be formed by dispersing the first fluorescent substance within a center portion of a transparent light-guiding member and the converter may be formed by dispersing a second fluorescent substance within an outer peripheral portion of the transparent light-guiding member, the second fluorescent substance absorbing the first light beam and emitting the second light beam.

The light guiding portion may include a transparent light-guiding member and a fluorescent layer disposed on a main surface of the transparent light-guiding member, the first fluorescent substance being dispersed within the fluorescent layer.

The fluorescent layer may be a fluorescent film formed by dispersing the first fluorescent substance within a transparent film.

The fluorescent layer may be an adhesive layer obtained by dispersing the first fluorescent substance within a transparent resin that bonds together the transparent light-guiding member and a transparent member stacked on the main surface of the transparent light-guiding member.

The converter may be a fluorescent light-guiding member within which a second fluorescent substance that absorbs the first light beam and emits the second light beam is dispersed.

The converter may be an adhesive layer obtained by dispersing a second fluorescent substance within a transparent resin that bonds the transparent light-guiding member and the solar cell module together, the second fluorescent substance absorbing the first light beam and emitting the second light beam.

The converter may include a plurality of types of fluorescent substances, and the first light beam incident on the converter may be converted into the second light beam stepwise using the plurality of types of fluorescent substances.

Reflective layers that reflect the second light beam may be disposed on surfaces of the converter other than a surface that faces the solar cell.

A solar generator according to another aspect of the present invention includes the solar cell module according to the aspect of the present invention.

Advantageous Effects of Invention

According to the aspect of the present invention, it is possible to provide a solar cell module that highly efficiently generates power and a solar generator including the solar cell module.

DESCRIPTION OF EMBODIMENTS

First Embodiment

Figure 1:
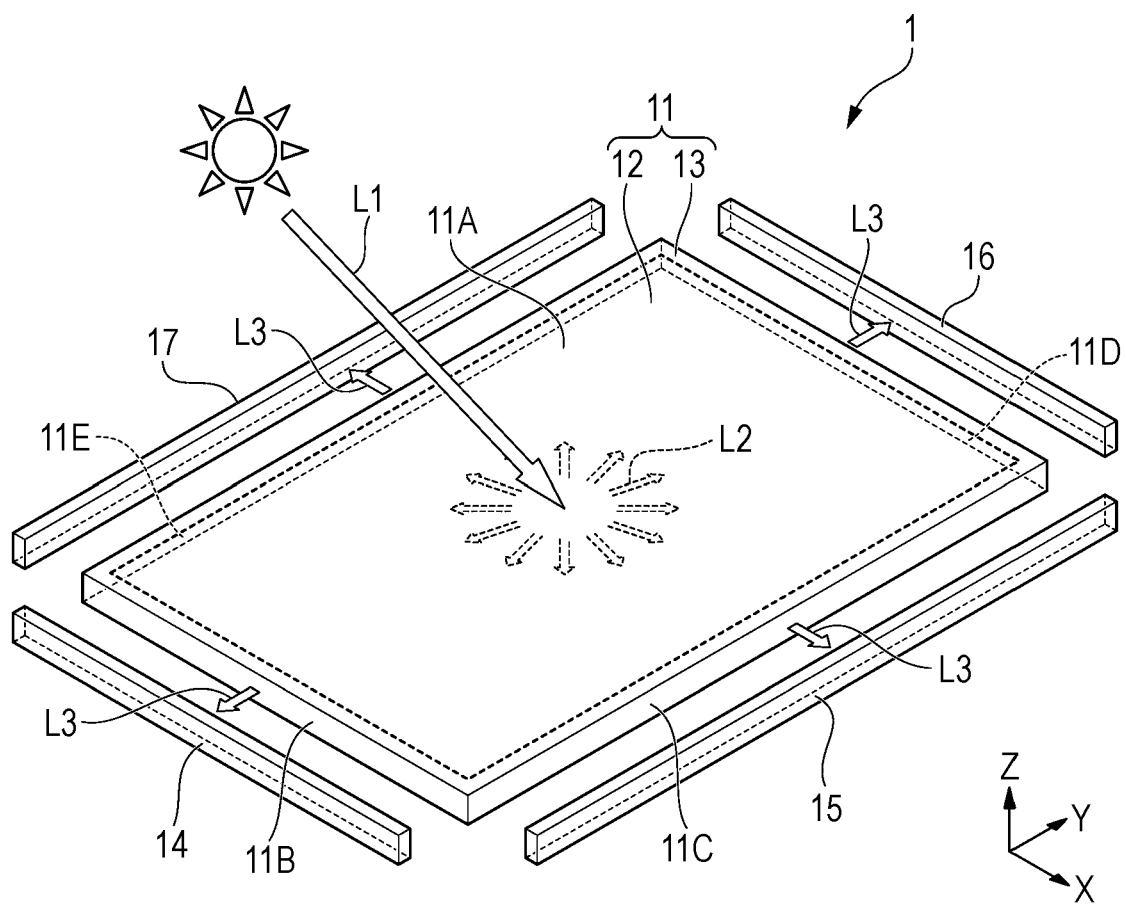
FIG. 1 is an exploded perspective view of a solar cell module according to a first embodiment.

FIG. 1 is an exploded perspective view of a solar cell module 1 according to a first embodiment.

The solar cell module 1 includes a fluorescent light-guiding member 11 and multiple solar cells 14, 15, 16, and 17 that receive light beams L3 emitted from end surfaces 11B, 11C, 11D, and 11E of the fluorescent light-guiding member 11.

The fluorescent light-guiding member 11 is a substantially rectangular plate member having a first main surface 11A that is perpendicular to the Z axis (parallel to the XY plane). The fluorescent light-guiding member 11 includes a light guiding portion 12, within which a first fluorescent substance is dispersed, and a converter 13, within which a second fluorescent substance is dispersed. The light guiding portion 12 is positioned at a central area of the fluorescent light-guiding member 11. The converter 13 surrounds the outer periphery of the light guiding portion 12 and forms a rectangular frame along the four end surfaces 11B, 11C, 11D, and 11E of the fluorescent light-guiding member 11. A portion of the first main surface 11A of the fluorescent light-guiding member 11 that overlaps the light guiding portion 12 is a light-incident surface, and the four end surfaces 11B, 11C, 11D, and 11E of the fluorescent light-guiding member 11 are light-emergent surfaces.

The light guiding portion 12 converts part of an external light beam L1 (sunlight, for example) incident on the first main surface 11A into first light beams L2 using the first fluorescent substance and transmits the first light beams L2 toward the end surfaces 11B, 11C, 11D, and 11E. The converter 13 converts the first light beams L2 incident from the light guiding portion 12 into second light beams L3, to which the solar cells 14, 15, 16, and 17 have higher spectral sensitivity than to the first light beams L2, using the second fluorescent substance, and emits the second light beams L3 from the end surfaces 11B, 11C, 11D, and 11E.

The solar cells 14, 15, 16, and 17 are disposed on the four end surfaces 11B, 11C, 11D, and 11E of the fluorescent light-guiding member 11, respectively. Light receiving surfaces of the solar cells 14, 15, 16, and 17 face the end surfaces 11B, 11C, 11D, and 11E of the fluorescent light-guiding member 11 and the solar cells 14, 15, 16, and 17 are bonded to the end surfaces 11B, 11C, 11D, and 11E of the fluorescent light-guiding member 11.

Publicly known solar cells, such as silicon solar cells, compound solar cells, or organic solar cells may be used as the solar cells 14, 15, 16, and 17.

Figure 2:
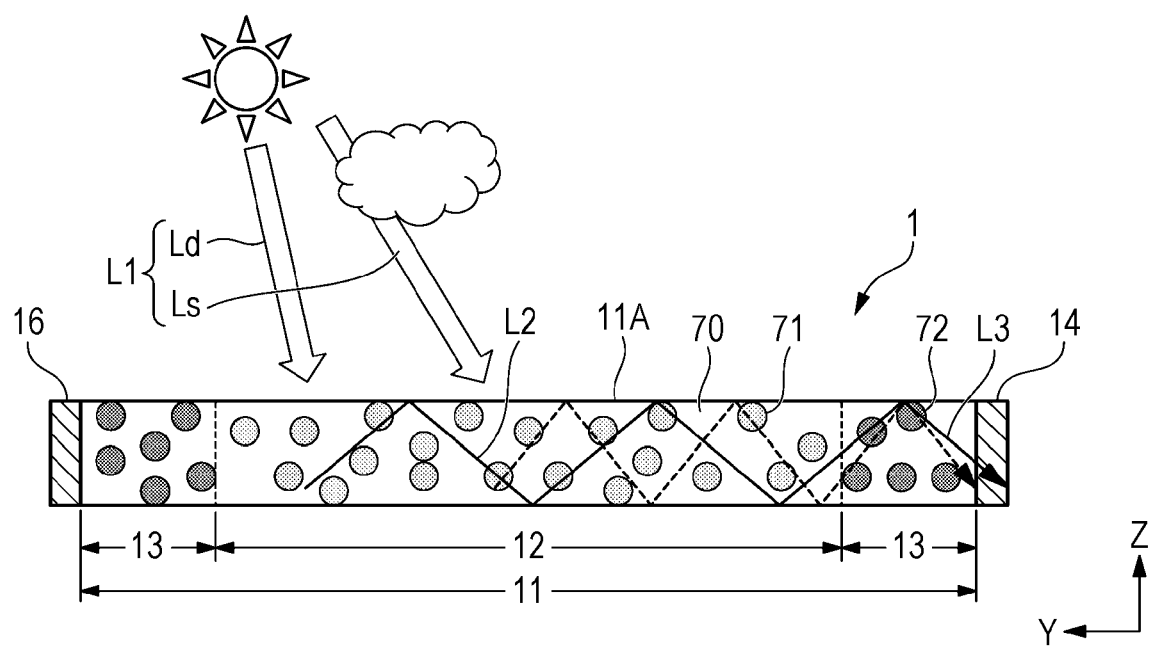
FIG. 2 is a cross sectional view of the solar cell module according to the first embodiment.

FIG. 2 is a cross sectional view of the solar cell module 1.

A first fluorescent substance 71 is dispersed within a center portion of the fluorescent light-guiding member 11, the first fluorescent substance 71 absorbing ultraviolet light or visible light included in the external light beam L1 and emitting a first light beam L1 including visible light or infrared light. A second fluorescent substance 72 is dispersed within an outer peripheral portion of the fluorescent light-guiding member 11, the second fluorescent substance 72 absorbing visible light or infrared light included in the first light beam L2 and emitting a second light beam L3 including visible light or infrared light.

Here, the visible light is light having wavelengths ranging from 380 nm to 750 nm, inclusive, the ultraviolet light is light having wavelengths below 380 nm, and the infrared light is light having wavelengths above 750 nm.

For example, a fluorescent substance Lumogen F Red 305 (trade name) manufactured by BASF SE that has an emission spectrum with a peak wavelength at 578 nm is used as the first fluorescent substance 71. A fluorescent substance NILE BLUE A Perchlorate (CAS registry No. 3625-57-8) that has an emission spectrum with a peak wavelength at 640 nm is used as the second fluorescent substance 72. GaAs solar cells that have high spectral sensitivity to the light beam L3 emitted from the second fluorescent substance 72 are used as the solar cells 14, 15, 16, and 17 (only the solar cells 14 and 16 are illustrated in FIG. 2).

A portion of the fluorescent light-guiding member 11 within which the first fluorescent substance 71 is dispersed is the light guiding portion 12 while a portion of the fluorescent light-guiding member 11 within which the second fluorescent substance 72 is dispersed is the converter 13. The light guiding portion 12 and the converter 13 are formed by respectively dispersing different types of fluorescent substances 71 and 72 within different regions of a transparent light-guiding member 70 made of a highly transparent organic or inorganic material, such as an acrylic resin, polycarbonate resin, or glass.

Part of the external light beam L1 incident on the fluorescent light-guiding member 11 from the first main surface 11A of the fluorescent light-guiding member 11 is absorbed by the first fluorescent substance 71, dispersed within the light guiding portion 12, and converted into the first light beams L2. The first light beams L2 emitted from the first fluorescent substance 71 propagate through the light guiding portion 12 while being totally reflected by the light guiding portion 12 and are then incident on the converter 13. Then, the first light beams L2 are absorbed by the second fluorescent substance 72, dispersed within the converter 13, and converted into the second light beams L3. Then, the second light beams L3 are incident on the solar cells 14, 15, 16, and 17 (only the solar cells 14 and 16 are illustrated in FIG. 2).

The external light beam L1 contains a direct light beam Ld, which is incident on the fluorescent light-guiding member 11 directly from a light source (the sun, for example), and a scattered light beam Ls, which is incident on the fluorescent light-guiding member 11 after being scattered by clouds or the like. Although the external light beam L1 contains the light beams Ld and Ls that are incident on the fluorescent light-guiding member 11 at various different angles, both light beams Ld and Ls are absorbed by the first fluorescent substance 71, dispersed in the fluorescent light-guiding member 11, and converted into the first light beams L2. The usability of light negligibly varies with the incident angle of the light, thereby leading to stable power generation.

Figure 3:
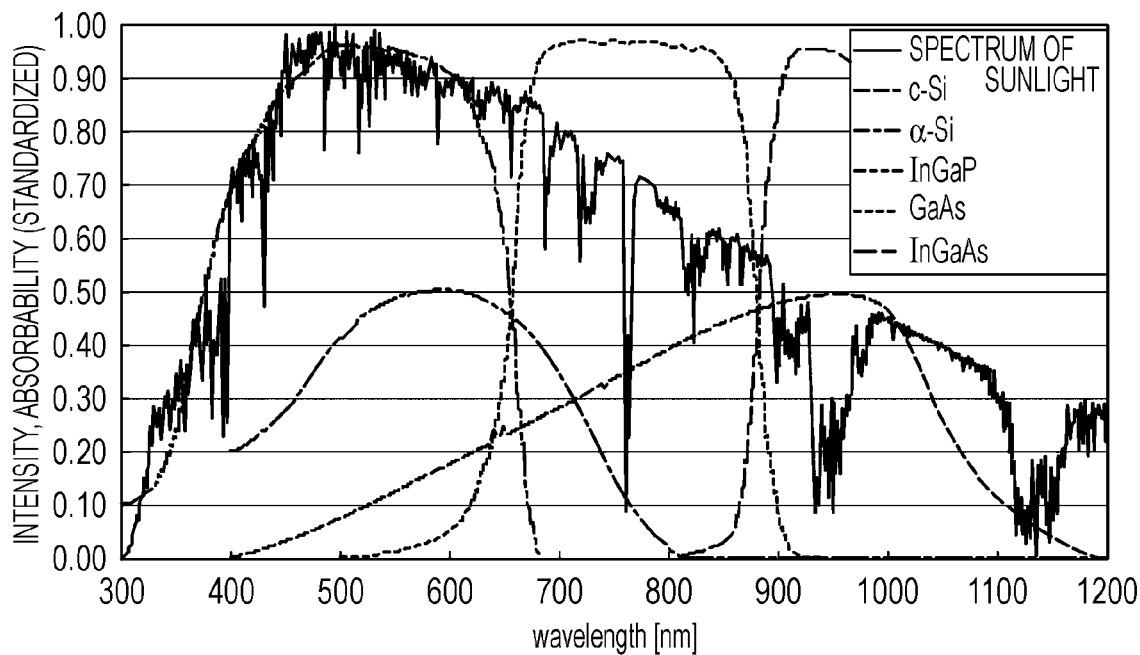
FIG. 3 illustrates a spectrum of sunlight and absorption spectrums of solar cells.
Figure 4:
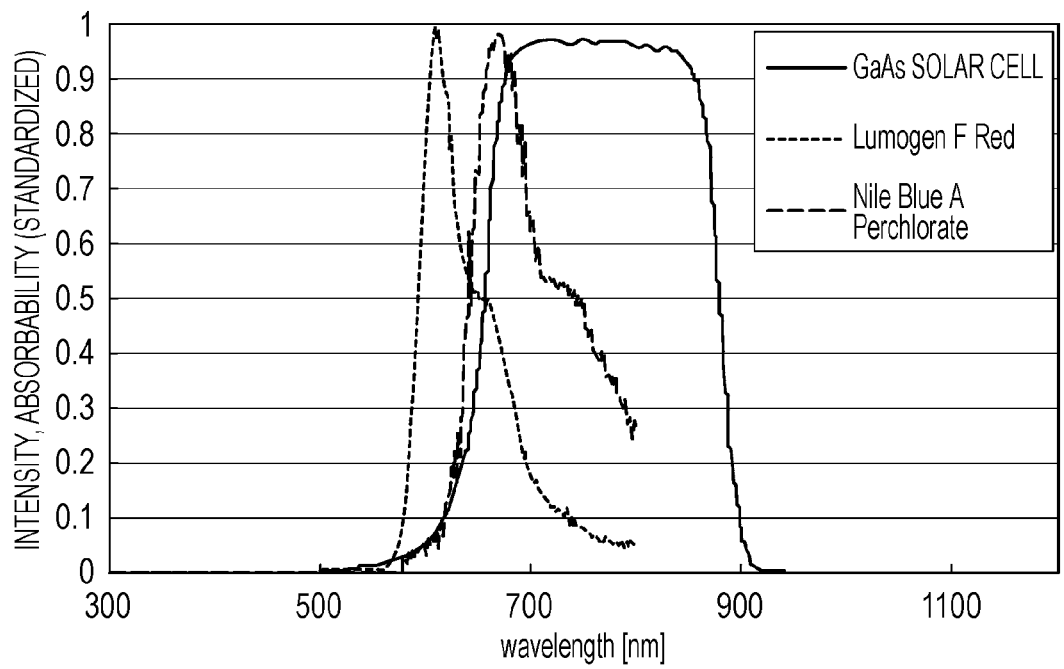
FIG. 4 illustrates emission spectrums of fluorescent substances and an absorption spectrum of a solar cell.

FIG. 3 illustrates a spectrum of sunlight L1 and absorption spectrums of the solar cells 14 to 17. FIG. 4 illustrates emission spectrums of the first fluorescent substance 71 (Lumogen F Red 305 (trade name) manufactured by BASF SE) and the second fluorescent substance 72 (NILE BLUE A Perchlorate (CAS registry No. 3625-57-8)) and an absorption spectrum of the solar cells 14 to 17.

As illustrated in FIG. 3, the efficiency with which a solar cell generates power varies with the wavelength of light incident on the solar cell. For example, a GaAs solar cell has high spectral sensitivity to light having wavelengths ranging from 650 nm to 850 nm, inclusive, but has a low spectral sensitivity to light having wavelengths not longer than 600 nm and not shorter than 900 nm. Even a solar cell made of a compound semiconductor, which generally generates power with high efficiency, cannot generate power with sufficiently high efficiency from light having wavelengths to which the solar cell has a low spectral sensitivity.

A material that is appropriate for the location at which or for the purpose for which the fluorescent light-guiding member 11 is installed is selected as the first fluorescent substance 71 included in the light guiding portion 12 of the fluorescent light-guiding member 11. For example, when the light guiding portion 12 of the fluorescent light-guiding member 11 is used as a window, a material having a faint color is selected as the first fluorescent substance 71 that is to be dispersed within the light guiding portion 12. In this case, even if the first fluorescent substance 71 were combined with any solar cell, the solar cell might not generate power with sufficiently high efficiency with the emission spectrum of the first fluorescent substance 71.

In view of this, in the solar cell module 1, the first light beam L2 emitted from the first fluorescent substance 71 is converted into the second light beam L3 to which the solar cells have high spectral sensitivity as illustrated in FIG. 4. For example, the emission spectrum of the first fluorescent substance 71 has a peak wavelength not longer than 600 nm in the example illustrated in FIG. 4. The light having this wavelength (first light beam), however, is light to which a solar cell using a GaAs semiconductor has a low spectral sensitivity. Thus, the first light beam is converted into light having a wavelength of 640 nm by using the second fluorescent substance 72. The light having this wavelength (second light beam) is light to which a solar cell using a GaAs semiconductor has high spectral sensitivity. Thus, the second light beam is efficiently converted into power by the solar cell.

As described above, the solar cell module 1 includes the converter 13 between the light guiding portion 12 and the solar cells 14, 15, 16, and 17, the converter 13 converting the first light beam L2, which propagates through the light guiding portion 12, into the second light beam L3 to which the solar cells 14, 15, 16, and 17 have high spectral sensitivity. Consequently, the light beams L3 that are incident on the solar cells 14, 15, 16, and 17 can be efficiently utilized to generate power, thereby highly efficiently generating power.

Second Embodiment

Figure 5:
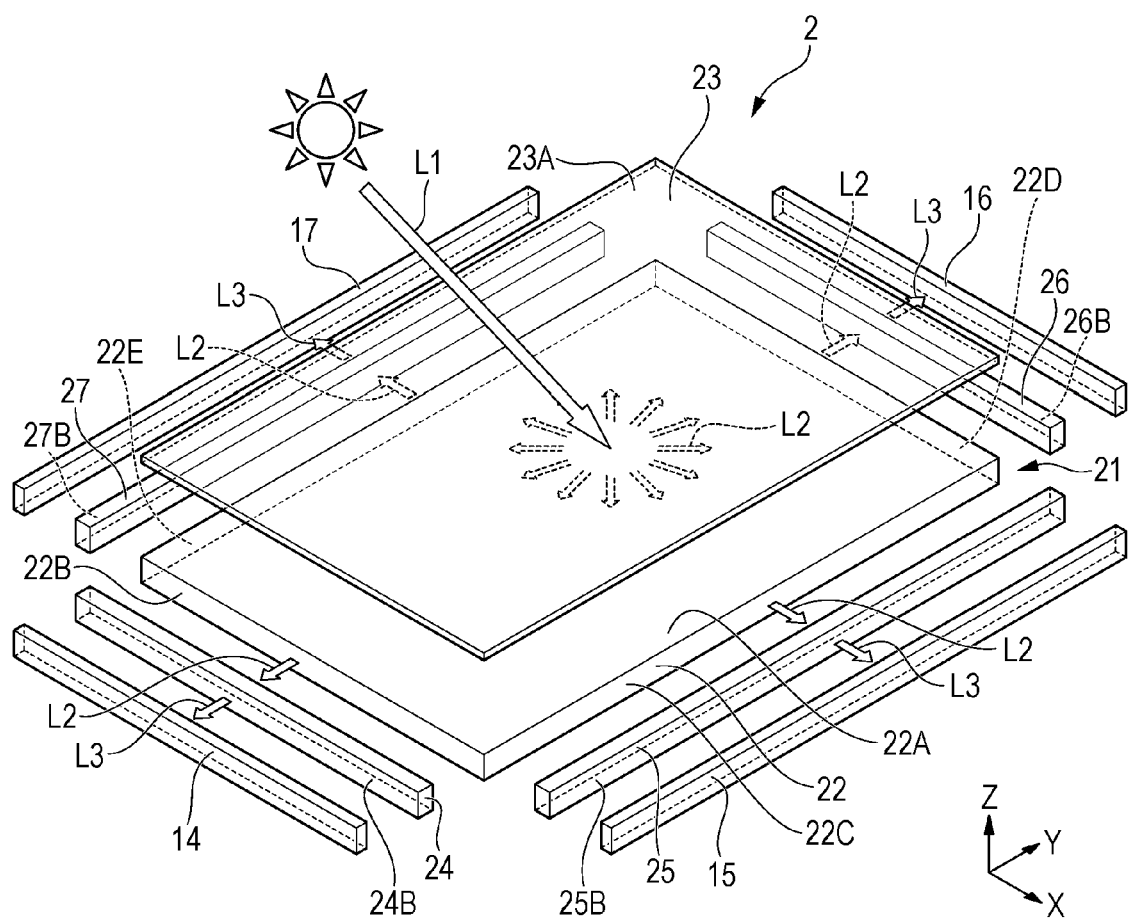
FIG. 5 is an exploded perspective view of a solar cell module according to a second embodiment.

FIG. 5 is an exploded perspective view of a solar cell module 2 according to a second embodiment. In the solar cell module 2, components that are the same as those of the solar cell module 1 according to the first embodiment are denoted by the same reference symbols and are not described in detail.

The solar cell module 2 includes a transparent light-guiding member 22, a fluorescent film 23 bonded to a first main surface 22A of the transparent light-guiding member 22, multiple fluorescent light-guiding members 24, 25, 26, and 27 disposed on end faces 22B, 22C, 22D, and 22E of the transparent light-guiding member 22, and multiple solar cells 14, 15, 16, and 17 that receive light beams L3 emitted from end faces 24B, 25B, 26B, and 27B of the fluorescent light-guiding members 24, 25, 26, and 27.

The fluorescent film 23 is a film-formed fluorescent layer within which a first fluorescent substance is dispersed. The fluorescent film 23 converts part of an external light beam L1 (sunlight, for example) incident on a first main surface 23A into first light beams L2 using the first fluorescent substance and emits the first light beams L2 to the transparent light-guiding member 22.

The transparent light-guiding member 22 is a substantially rectangular plate member having a first main surface 21A that is perpendicular to the Z axis (parallel to the XY plane). The transparent light-guiding member 22 is made of a material that is highly transparent and does not contain a fluorescent substance. Part of the first light beams L2 emitted from the fluorescent film 23 propagates through the transparent light-guiding member 22 toward the end faces 22B, 22C, 22D, and 22E of the transparent light-guiding member 22 while being totally reflected by the transparent light-guiding member 22.

Bar-shaped fluorescent light-guiding members 24, 25, 26, and 27 respectively extending along the four end faces 22B, 22C, 22D, and 22E of the transparent light-guiding member 22 are bonded to the end faces 22B, 22C, 22D, and 22E. A second fluorescent substance is dispersed within each of the fluorescent light-guiding members 24, 25, 26, and 27. The fluorescent light-guiding members 24, 25, 26, and 27 convert the first light beams L2, which are incident from the end faces 22B, 22C, 22D, and 22E of the transparent light-guiding member 22, into second light beams L3 to which the solar cells 14, 15, 16, and 17 have higher spectral sensitivity than to the first light beams L2, using the second fluorescent substance. Then, the fluorescent light-guiding members 24, 25, 26, and 27 emit the second light beams L3 from the end faces 24B, 25B, 26B, and 27B, respectively.

The solar cells 14, 15, 16, and 17 are disposed on the end faces 24B, 25B, 26B, and 27B of the fluorescent light-guiding members 24, 25, 26, and 27. Light receiving surfaces of the solar cells 14, 15, 16, and 17 face the end faces 24B, 25B, 26B, and 27B of the fluorescent light-guiding members 24, 25, 26, and 27 and the solar cells 14, 15, 16, and 17 are bonded to the end faces 24B, 25B, 26B, and 27B of the fluorescent light-guiding members 24, 25, 26, and 27.

Figure 6:
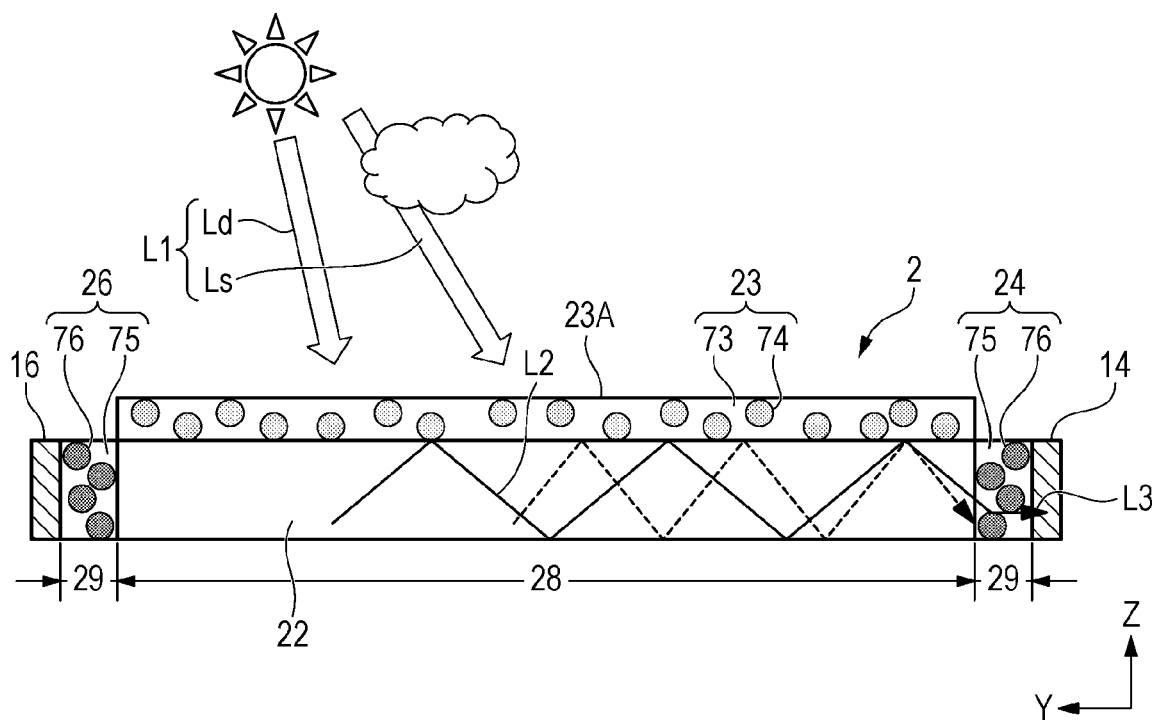
FIG. 6 is a cross sectional view of the solar cell module according to the second embodiment.

FIG. 6 is a cross sectional view of the solar cell module 2.

The fluorescent film 23 is obtained by dispersing the first fluorescent substance 74 within the transparent film 73, the first fluorescent substance 74 absorbing ultraviolet light or visible light included in the external light beam L1 and emitting a first light beam L1 including visible light or infrared light. For example, the fluorescent film 23 is formed by extending an acrylic resin material within which the first fluorescent substance 74 is dispersed so as to have a thickness as thin as approximately 0.1 mm. For example, a fluorescent substance Lumogen F Red 305 (trade name) manufactured by BASF SE that has an emission spectrum with a peak wavelength at 578 nm is used as the first fluorescent substance 74.

The transparent light-guiding member 22 is made of a highly transparent organic or inorganic material, such as an acrylic resin, polycarbonate resin, or glass. Although the transparent light-guiding member 22 is made of a highly transparent material not including a fluorescent substance, the transparent light-guiding member 22 may be made of a material that is not completely transparent and includes a small amount of fluorescent substance as long as the fluorescent substance is dispersed with no intention of converting the wavelength of light within the transparent light-guiding member 22.

The fluorescent light-guiding members 24, 25, 26, and 27 are obtained by dispersing a second fluorescent substance 76 within bar-shaped transparent light-guiding members 75 made of a highly transparent organic or inorganic material, such as an acrylic resin, polycarbonate resin, or glass, the second fluorescent substance 76 absorbing visible light or infrared light included in the first light beam L2 and emitting a second light beam L3 including visible light or infrared light. For example, a fluorescent substance NILE BLUE A Perchlorate (CAS registry No. 3625-57-8) having an emission spectrum with a peak wavelength at 640 nm is used as the second fluorescent substance 76.

Part of the external light beam L1 incident on the fluorescent film 23 from the first main surface 23A of the fluorescent film 23 is absorbed by the first fluorescent substance 74, dispersed within the fluorescent film 23, and converted into the first light beams L2. The first light beams L2 emitted from the first fluorescent substance 74 propagate through the transparent light-guiding member 22 while being totally reflected by the transparent light-guiding member 22 and are incident on the fluorescent light-guiding members 24, 25, 26, and 27 (only the fluorescent light-guiding members 24 and 26 are illustrated in FIG. 6). Then, the first light beams L2 are absorbed by the second fluorescent substance 76, dispersed within the fluorescent light-guiding members 24, 25, 26, and 27, and converted into the second light beams L3. The second light beams L3 are then incident on the solar cells 14, 15, 16, and 17 (only the solar cells 14 and 16 are illustrated in FIG. 6).

In the solar cell module 2, the fluorescent film 23 and the transparent light-guiding member 22 function as a light guiding portion 28 that absorbs part of the external light beam L1 using the first fluorescent substance 74 and transmits the first light beams L2 emitted from the first fluorescent substance 74 toward the solar cells 14, 15, 16, and 17. The fluorescent light-guiding members 24, 25, 26, and 27 function as converters 29 that absorb the first light beams L2 incident from the light guiding portion 28 using the second fluorescent substance 76 and cause the second light beams L3 emitted from the second fluorescent substance 76 to be incident on the solar cells 14, 15, 16, and 17.

In the solar cell module 2, the light guiding portion 28 includes the fluorescent film 23 and the transparent light-guiding member 22. Thus, the first light beams L2 emitted from the fluorescent film 22 propagate through the transparent light-guiding member 22 without being absorbed by the first fluorescent substance. For example, in the solar cell module 1 according to the first embodiment, the first light beams L2 transmitting through the light guiding portion 12 are partially absorbed by the first fluorescent substance 71 dispersed within the light guiding portion 12, resulting in a loss of light. On the other hand, in the solar cell module 2 according to the second embodiment, the amount of loss due to such self absorption is reduced and almost the entirety of the first light beams L2 emitted from the fluorescent film 23 are incident on the converters 29. Thus, the solar cell module 2 that highly efficiently generates power is provided.

In the solar cell module 2, a member that emits fluorescence has a film form and is bonded to the first main surface 22A of the transparent light-guiding member 22. Thus, the fluorescent film 23 can be maintained only by replacing the fluorescent film 23. In the case, for example, where the fluorescent film 23 is torn or the color of the fluorescent film 23 is to be changed, the fluorescent film 23 only has to be replaced with another fluorescent film. The fluorescent light-guiding members 24, 25, 26, and 27 can be maintained in the same manner. The fluorescent light-guiding members 24, 25, 26, and 27 can be each maintained by being removed from the transparent light-guiding member 22 and bonding another fluorescent light-guiding member to the transparent light-guiding member 22.

In the solar cell module 2, the light guiding portion 28 and the converter 29 include three kinds of members (the fluorescent film 23, the transparent light-guiding member 22, and the fluorescent light-guiding members 24, 25, 26, and 27). Thus, compared with the case of the solar cell module 1 according to the first embodiment in which the light guiding portion and the converter are integrated into one unit, components in the solar cell module 2 can be individually replaced, thereby reducing the maintenance cost.

Third Embodiment

Figure 7:
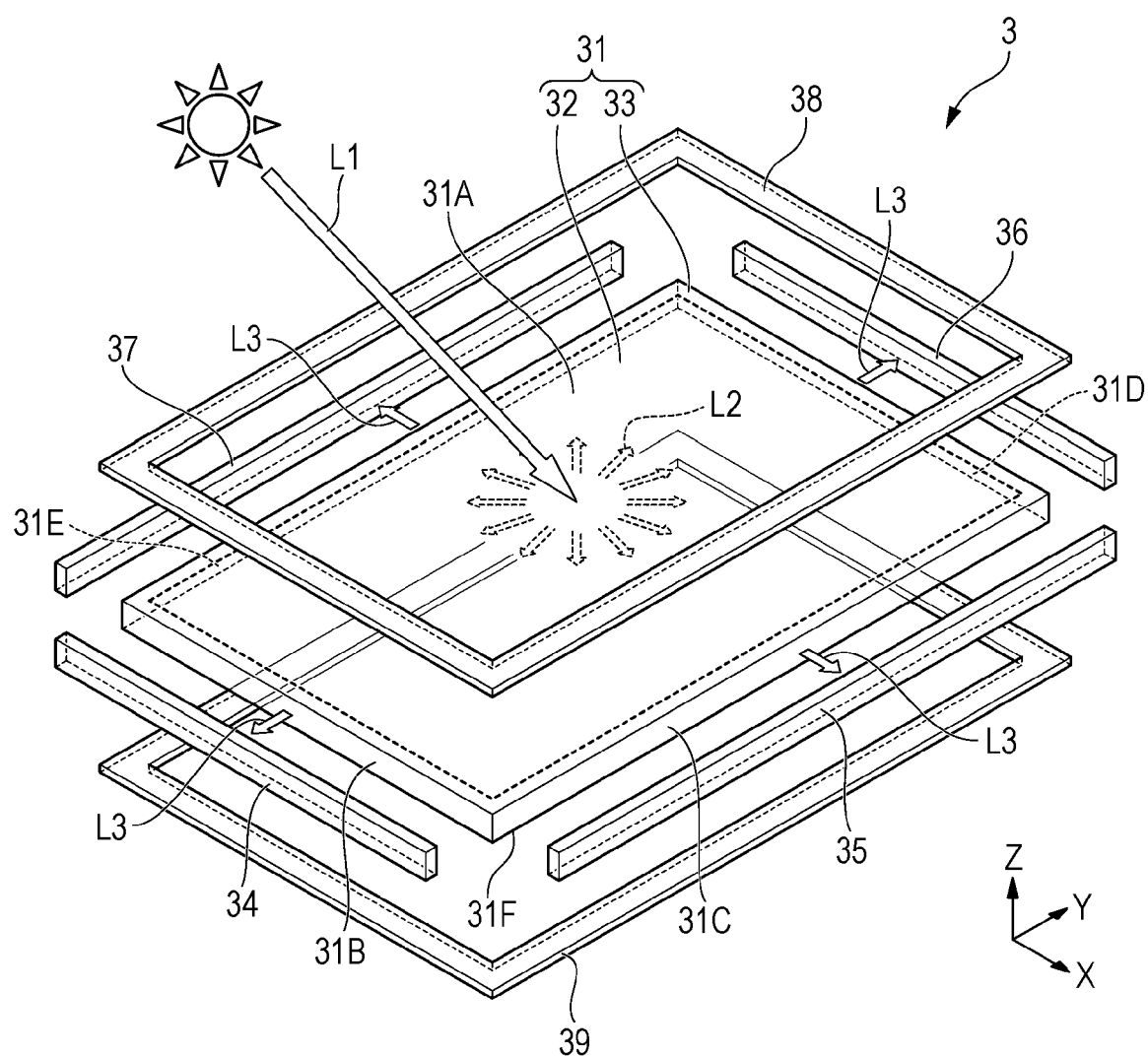
FIG. 7 is an exploded perspective view of a solar cell module according to a third embodiment.

FIG. 7 is an exploded perspective view of a solar cell module 3 according to a third embodiment. In the solar cell module 3, components that are the same as those of the solar cell module 1 according to the first embodiment are denoted by the same reference symbols and are not described in detail.

The solar cell module 3 includes a fluorescent light-guiding member 31, multiple solar cells 34, 35, 36, and 37, which receive light beams L3 emitted from end surfaces 31B, 31C, 31D, and 31E of the fluorescent light-guiding member 31, and reflecting layers 38 and 39, which cover outer peripheral portions of the fluorescent light-guiding member 31.

The fluorescent light-guiding member 31 is a substantially rectangular plate member having a first main surface 31A that is perpendicular to the Z axis (parallel to the XY plane). The fluorescent light-guiding member 31 includes a light guiding portion 32, within which a first fluorescent substance is dispersed, and a converter 33, within which a second fluorescent substance is dispersed. The light guiding portion 32 is positioned at a central area of the fluorescent light-guiding member 31. The converter 33 surrounds the outer periphery of the light guiding portion 32 and forms a rectangular frame along the four end surfaces 31B, 31C, 31D, and 31E of the fluorescent light-guiding member 31. A portion of the first main surface 31A of the fluorescent light-guiding member 31 that overlaps the light guiding portion 32 is a light-incident surface and the four end surfaces 31B, 31C, 31D, and 31E of the fluorescent light-guiding member 31 are light-emergent surfaces.

The light guiding portion 32 converts part of the external light beam L1 (sunlight, for example) incident on the first main surface 31A into first light beams L2 using the first fluorescent substance and transmits the first light beams L2 toward the end surfaces 31B, 31C, 31D, and 31E. The converter 33 converts the first light beams L2 incident from the light guiding portion 32 using the second fluorescent substance into second light beams L3 to which the solar cells 34, 35, 36, and 37 have higher spectral sensitivity than to the first light beams L2. Then, the converter 33 emits the second light beams L3 from the end surfaces 31B, 31C, 31D, and 31E.

The solar cells 34, 35, 36, and 37 are disposed on the four end surfaces 31B, 31C, 31D, and 31E of the fluorescent light-guiding member 31. Light receiving surfaces of the solar cells 34, 35, 36, and 37 face the end surfaces 31B, 31C, 31D, and 31E of the fluorescent light-guiding member 31 and the solar cells 34, 35, 36, and 37 are bonded to the end surfaces 31B, 31C, 31D, and 31E of the fluorescent light-guiding member 31.

Publicly known solar cells, such as silicon solar cells, compound solar cells, or organic solar cells may be used as the solar cells 34, 35, 36, and 37.

The reflecting layers 38 and 39 are disposed on outer peripheral portions of the fluorescent light-guiding member 31 to prevent light from leaking out from the first main surface 31A and a second main surface 31F. The reflecting layers 38 and 39 form rectangular frames along the four end surfaces 31B, 31C, 31D, and 31E of the fluorescent light-guiding member 31 so as to cover side surfaces of the solar cells 34, 35, 36, and 37 and surfaces of the converter 33 other than the surfaces that face the solar cells 34, 35, 36, and 37.

Figure 8:
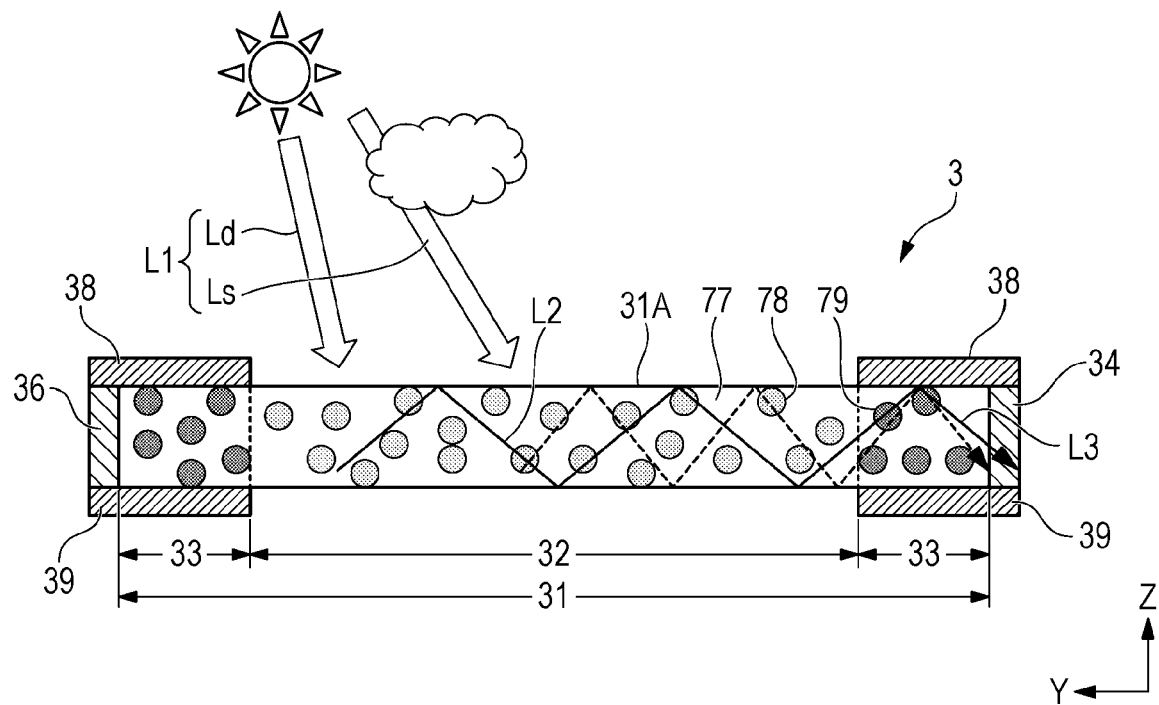
FIG. 8 is a cross sectional view of the solar cell module according to the third embodiment.

FIG. 8 is a cross sectional view of the solar cell module 3.

A first fluorescent substance 78 is dispersed within a center portion of the fluorescent light-guiding member 31, the first fluorescent substance 78 absorbing ultraviolet light or visible light included in the external light beam L1 and emitting a first light beam L1 including visible light or infrared light. A second fluorescent substance 79 is dispersed within an outer peripheral portion of the fluorescent light-guiding member 31, the second fluorescent substance 79 absorbing visible light or infrared light included in the first light beam L2 and emitting a second light beam L3 including visible light or infrared light.

For example, a fluorescent substance Lumogen F Violet 570 (trade name) manufactured by BASF SE having an emission spectrum with a peak wavelength at 413 nm is used as the first fluorescent substance 78 and a fluorescent substance Lumogen F Yellow 170 (trade name) manufactured by BASF SE having an emission spectrum with a peak wavelength at 528 nm is used as the second fluorescent substance 79. Amorphous silicon solar cells that have high spectral sensitivity to the light beams L3 emitted from the second fluorescent substance 79 are used as the solar cells 34, 35, 36, and 37 (only the solar cells 34 and 36 are illustrated in FIG. 8).

A portion of the fluorescent light-guiding member 31 within which the first fluorescent substance 78 is dispersed is the light guiding portion 32. A portion of the fluorescent light-guiding member 31 within which the second fluorescent substance 79 is dispersed is the converter 33. The light guiding portion 32 and the converter 33 are formed by respectively dispersing different types of fluorescent substances 78 and 79 within different regions of a transparent light-guiding member 77 made of a highly transparent organic or inorganic material, such as an acrylic resin, polycarbonate resin, or glass.

Part of the external light beam L1 incident on the fluorescent light-guiding member 31 from the first main surface 31A of the fluorescent light-guiding member 31 is absorbed by the first fluorescent substance 78, dispersed within the light guiding portion 32, and converted into the first light beams L2. The first light beams L2 emitted from the first fluorescent substance 78 propagate through the light guiding portion 32 while being totally reflected by the light guiding portion 32 and then are incident on the converter 13. Then, the first light beams L2 are absorbed by the second fluorescent substance 79, dispersed within the converter 33, and converted into the second light beams L3. Then, the second light beams L3 are incident on the solar cells 34, 35, 36, and 37 (only the solar cells 34 and 36 are illustrated in FIG. 8).

The second light beams L3 emitted from the second fluorescent substance 79 propagate through the converter 33 toward the end faces of the fluorescent light-guiding member 31 while being totally reflected by the converter 33. The second light beams L3 that are incident on the first main surface 31A and the second main surface 31F of the fluorescent light-guiding member 31 at an angle at which the second light beams L3 are not totally reflected to a sufficiently high extent are reflected by the reflecting layers 38 and 39 and propagate through the converter 33. Thus, the second light beams L3 are efficiently incident on the solar cells while being prevented from leaking out from the first main surface 31A and the second main surface 31F.

Figure 9:
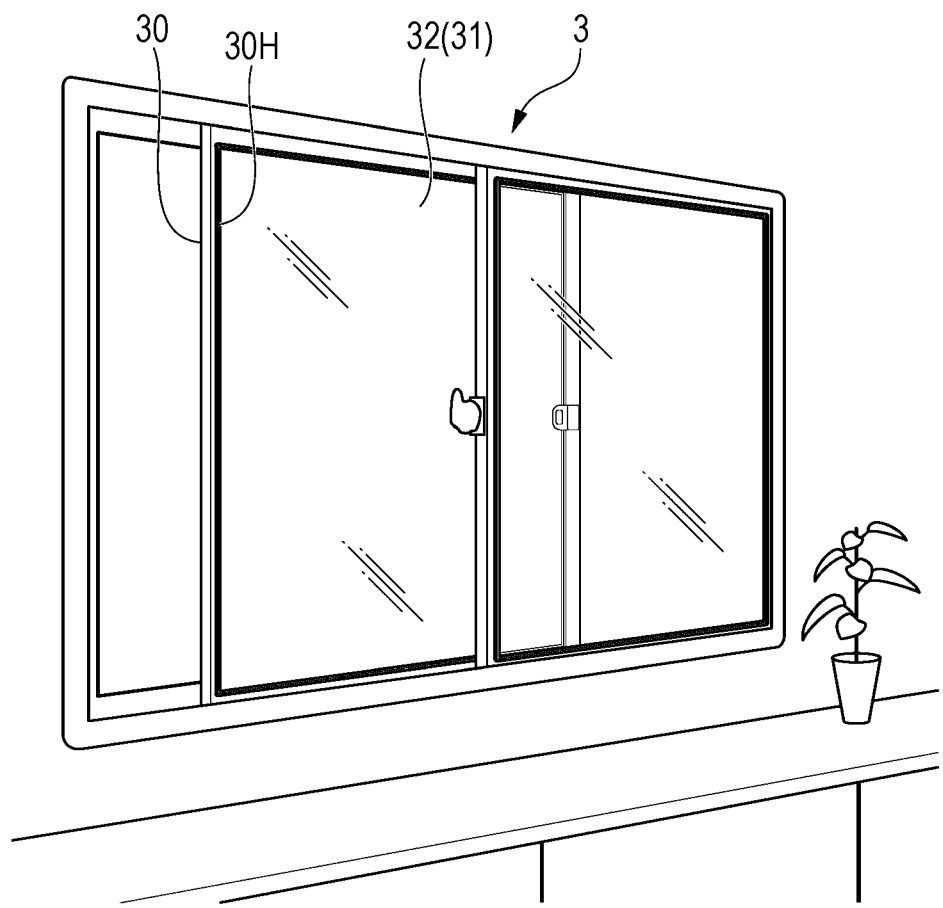
FIG. 9 is a schematic diagram of a solar generator including the solar cell module according to the third embodiment.
Figure 10:
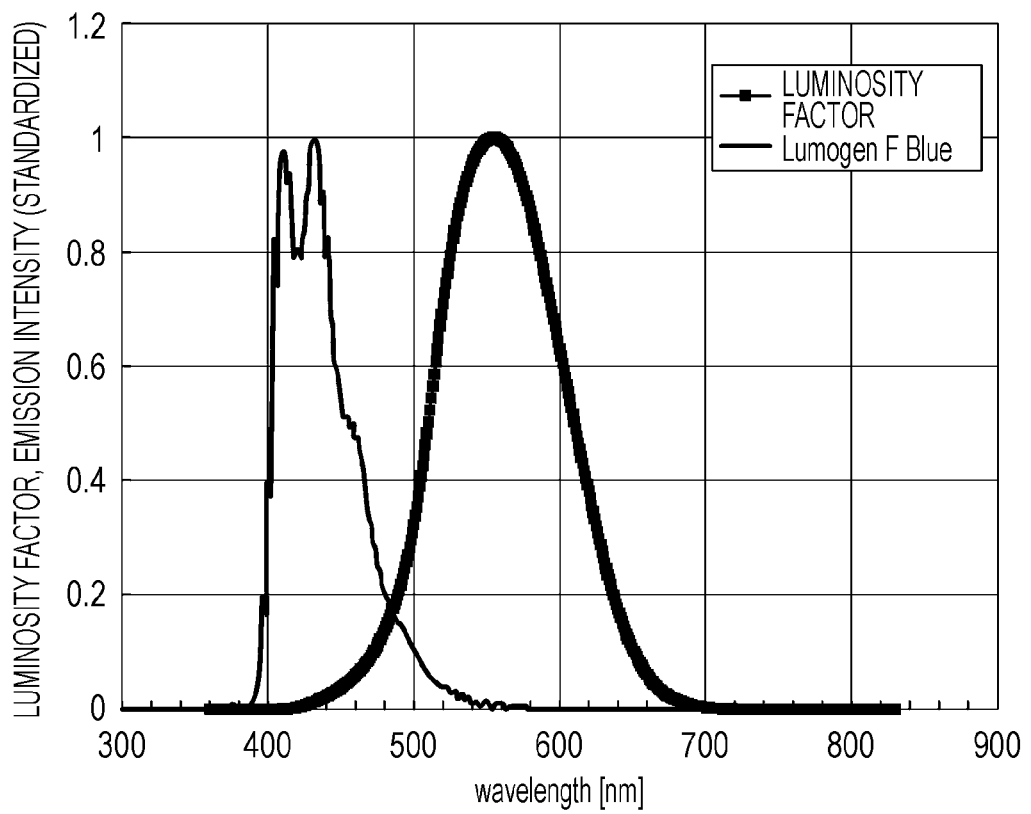
FIG. 10 illustrates an emission spectrum of a fluorescent substance and the dependence of luminosity factor on wavelength.
Figure 11:
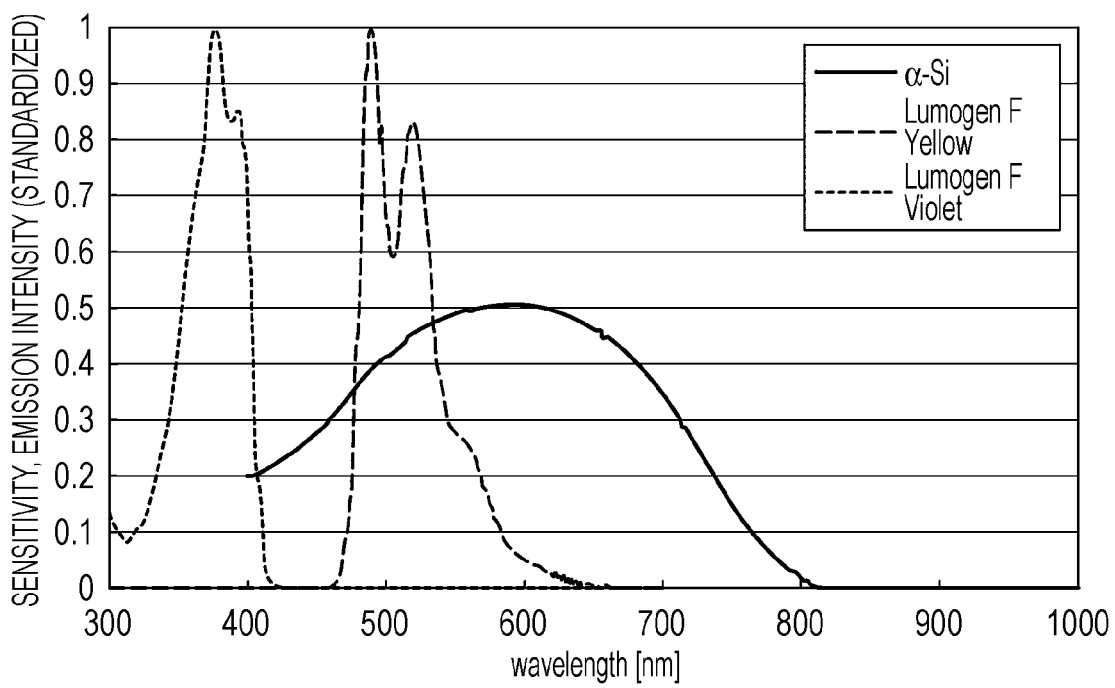
FIG. 11 illustrates emission spectrums of fluorescent substances and an absorption spectrum of a solar cell.

FIG. 9 is a schematic diagram of a window-type solar cell module in which the light guiding portion 32 of the solar cell module 3 is used as a window. FIG. 10 illustrates an emission spectrum of a fluorescent substance Lumogen F Blue 650 (trade name) manufactured by BASF SE and used as a first fluorescent substance and the dependence of luminosity factor on wavelength. FIG. 11 illustrates emission spectrums of a first fluorescent substance (Lumogen F Violet 570 (trade name) manufactured by BASF SE) and a second fluorescent substance (Lumogen F Yellow 170 (trade name) manufactured by BASF SE) and an absorption spectrum of a solar cell (an amorphous silicon solar cell).

As illustrated in FIG. 9, the solar cell module 3 includes a window frame 30 that holds an outer peripheral portion of the fluorescent light-guiding member 31. Only the light guiding portion 32 of the fluorescent light-guiding member 31 is exposed through an opening 30H of the window frame 30 and the reflecting layers 38 and 39 illustrated in FIG. 7 are covered by the window frame 30. Together with the reflecting layers 38 and 39, the converter 33 and the solar cells 34, 35, 36, and 37 illustrated in FIG. 7 are also disposed inside the window frame 30 and are not exposed to the outside. Only the light guiding portion 32 is visibly perceived as a window.

As illustrated in FIG. 10, for example, a first fluorescent substance (Lumogen F Blue 650 (trade name) manufactured by BASF SE) having an emission spectrum with a peak wavelength at 413 nm is dispersed within the light guiding portion 32. The peak of the emission of the first fluorescent substance falls in a wavelength range that has a luminosity factor that is considered low for the human eye. For this reason, the color of the light guiding portion 32 is negligibly perceived by the human eye and thus the light guiding portion 32 serves as a highly transparent window.

FIG. 11 is a graph for the case where a fluorescent substance Lumogen F Violet 570 (trade name) manufactured by BASF SE having an emission spectrum with a peak wavelength at or around 380 nm is used as an example of a first fluorescent substance. The peak of the emission of this fluorescent substance also falls in a wavelength range that has a luminosity factor that is considered low for the human eye. In this case, the first light beam emitted from the light guiding portion is converted into a second light beam having an emission spectrum with a peak wavelength at 528 nm, for example, using the second fluorescent substance included in the converter. The peak of the emission of the second fluorescent substance falls in a wavelength range to which an amorphous silicon solar cell has high spectral sensitivity. Thus, a solar cell module that highly efficiently generates power is obtained.

Fourth Embodiment

Figure 12:
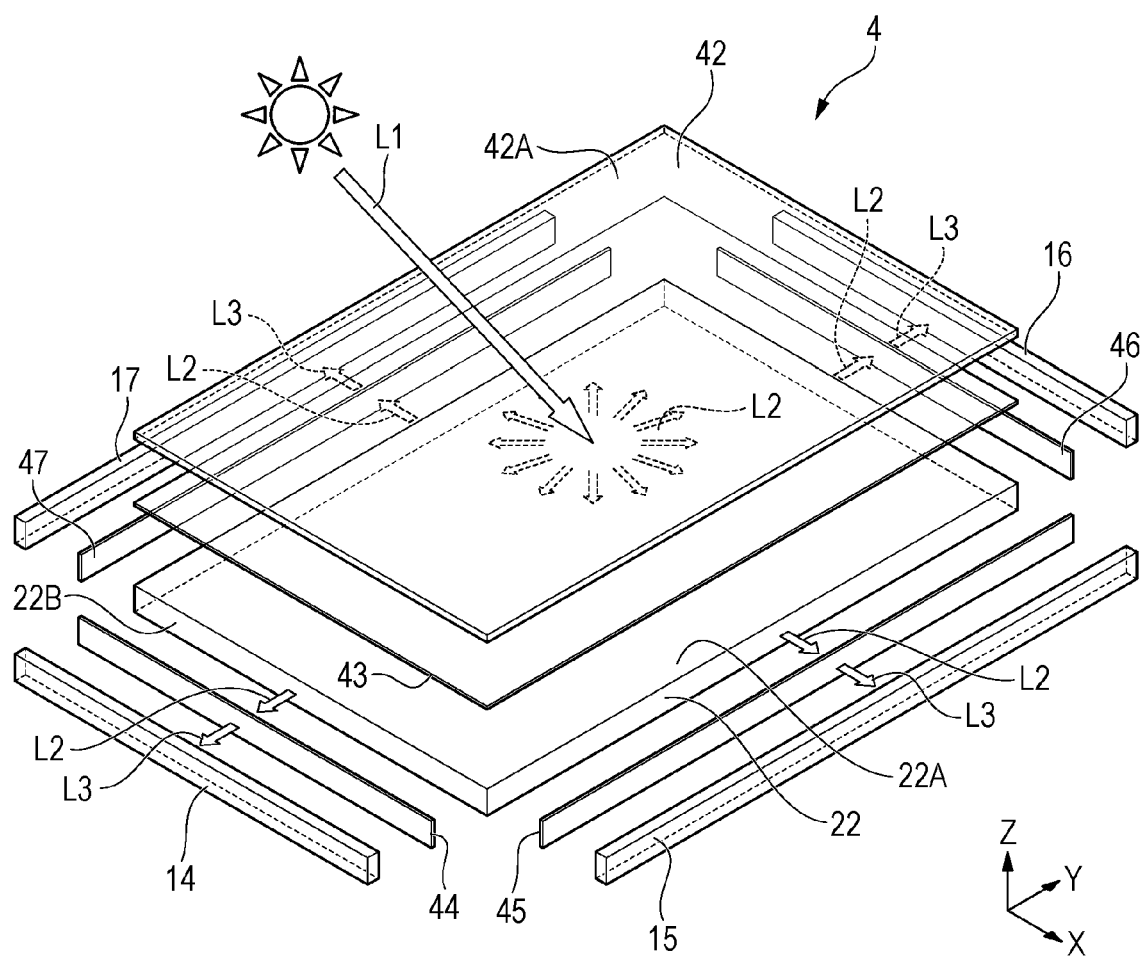
FIG. 12 is an exploded perspective view of a solar cell module according to a fourth embodiment.

FIG. 12 is an exploded perspective view of a solar cell module 4 according to a fourth embodiment. In the solar cell module 4, components that are the same as those of the solar cell module 1 according to the first embodiment and those of the solar cell module 2 according to the second embodiment are denoted by the same reference symbols and are not described in detail.

The solar cell module 4 includes a transparent light-guiding member 22, a transparent member 42 bonded to a first main surface 22A of the transparent light-guiding member 22 with a first adhesive layer 43 interposed therebetween, and multiple solar cells 14, 15, 16, and 17 bonded to end faces 22B, 22C, 22D, and 22E of the transparent light-guiding member 22 with second adhesive layers 44, 45, 46, and 47 interposed therebetween, the solar cells 14, 15, 16, and 17 receiving light beams L3 emitted from the end faces 22B, 22C, 22D, and 22E of the transparent light-guiding member 22.

A first fluorescent substance is dispersed within the first adhesive layer 43. The first adhesive layer 43 converts part of the external light beam L1 (sunlight, for example) incident from a first main surface 42A of the transparent member 42 into first light beams L2 using the first fluorescent substance and emits the first light beams L2 toward the transparent light-guiding member 22. The transparent member 42 is a protective member that protects the surface of the transparent light-guiding member 22. The first adhesive layer 43 is disposed over the entirety of a portion of the transparent light-guiding member 22 that faces the transparent member 42.

The transparent light-guiding member 22 is a substantially rectangular plate member having a first main surface 21A that is perpendicular to the Z axis (parallel to the XY plane). The transparent light-guiding member 22 is made of a highly transparent material not including a fluorescent substance. Part of the first light beam L2 emitted from the first adhesive layer 43 propagates through the transparent light-guiding member 22 toward the end faces 22B, 22C, 22D, and 22E of the transparent light-guiding member 22 while being totally reflected by the transparent light-guiding member 22.

A second fluorescent substance is dispersed within each of the second adhesive layers 44, 45, 46, and 47. The second adhesive layers 44, 45, 46, and 47 convert the first light beams L2 incident from the end faces 22B, 22C, 22D, and 22E of the transparent light-guiding member 22 into second light beams L3 to which the solar cells 14, 15, 16, and 17 have higher spectral sensitivity than to the first light beams L2 using the second fluorescent substance. Then, the second adhesive layers 44, 45, 46, and 47 emit the second light beams L3 toward the solar cells 14, 15, 16, and 17. The second adhesive layers 44, 45, 46, and 47 are disposed over the entirety of a portion of the transparent light-guiding member 22 that faces the solar cells 14, 15, 16, and 17.

The solar cells 14, 15, 16, and 17 are disposed on the end faces 22B, 22C, 22D, and 22E of the transparent light-guiding member 22. Light receiving surfaces of the solar cells 14, 15, 16, and 17 face the end faces 24B, 25B, 26B, and 27B of the fluorescent light-guiding members 24, 25, 26, and 27 and the solar cells 14, 15, 16, and 17 are bonded to the end faces 24B, 25B, 26B, and 27B of the fluorescent light-guiding members 24, 25, 26, and 27 via the second adhesive layers 44, 45, 46, and 47.

Figure 13:
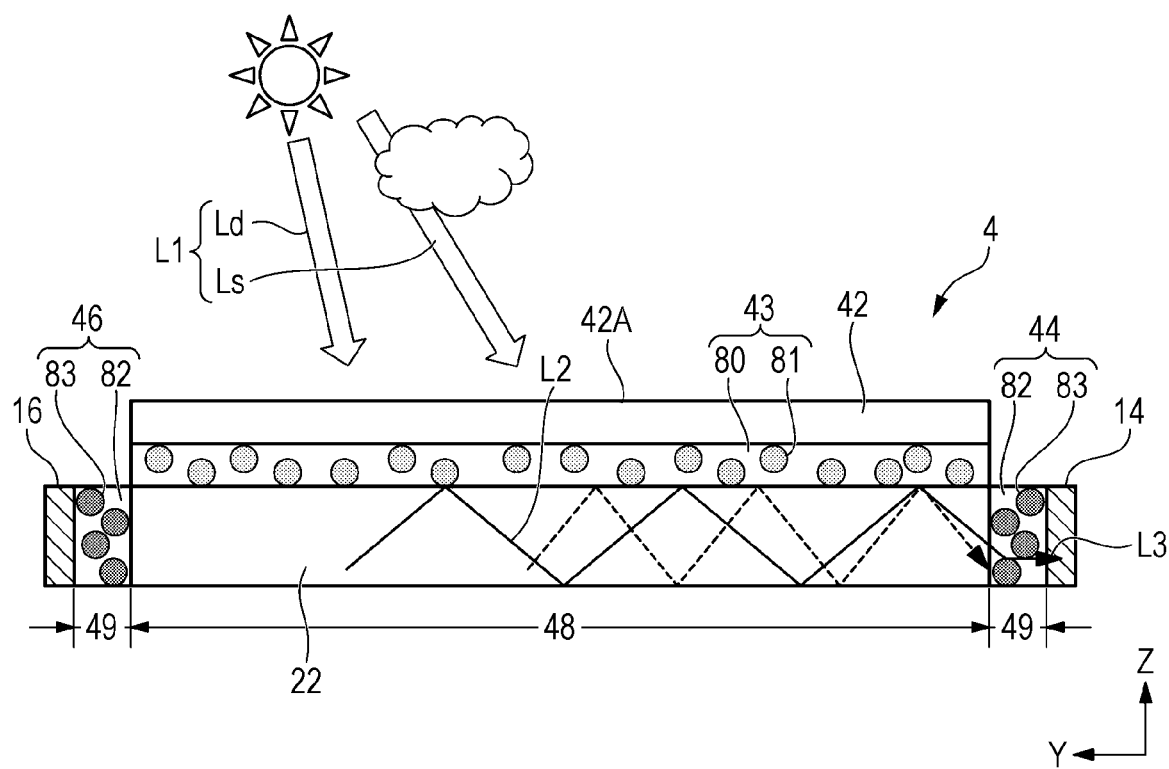
FIG. 13 is a cross sectional view of the solar cell module according to the fourth embodiment.

FIG. 13 is a cross sectional view of the solar cell module 4.

The first adhesive layer 43 is a fluorescent layer obtained by dispersing a first fluorescent substance 81 within a transparent resin 80, the first fluorescent substance 81 absorbing ultraviolet light or visible light included in the external light beam L1 and emitting a first light beam L1 including visible light or infrared light. The first adhesive layer 43 is formed, for example, by extending a phenol-based thermosetting adhesive within which the first fluorescent substance 81 is dispersed so as to uniformly have a thickness of approximately 0.1 mm. As an example of the first fluorescent substance 81, a fluorescent substance Lumogen F Red 305 (trade name) manufactured by BASF SE having an emission spectrum with a peak wavelength at 578 nm is used.

The second adhesive layers 44, 45, 46, and 47 are obtained by dispersing a second fluorescent substance 83 within a transparent resin 82, the second fluorescent substance 83 absorbing visible light or infrared light included in the first light beam L2 and emitting a second light beam L3 including visible light or infrared light. The second adhesive layers 44, 45, 46, and 47 are each formed, for example, by extending a phenol-based thermosetting adhesive within which the second fluorescent substance 83 is dispersed so as to uniformly have a thickness of approximately 0.1 mm. As an example of the second fluorescent substance 83, a fluorescent substance NILE BLUE A Perchlorate (CAS registry No. 3625-57-8) having an emission spectrum with a peak wavelength at 640 nm is used.

An ultraviolet curable resin or a thermosetting resin may be used as the transparent resins 80 and 82. Some of ultraviolet curable resins might not match the fluorescent substances 81 and 83 well when used as the transparent resins 80 and 82, and thus the fluorescent substances 81 and 83 may poorly emit light. In that case, a thermosetting resin may be alternatively used as the transparent resins 80 and 82. Examples of the thermosetting resin include an epoxy resin, a urea formaldehyde resin, and a melamine resin in addition to a phenolic resin.

The transparent light-guiding member 22 is made of a highly transparent organic or inorganic material, such as an acrylic resin, polycarbonate resin, or glass. Although the transparent light-guiding member 22 is made of a highly transparent material not including a fluorescent substance, the transparent light-guiding member 22 may be made of a material that is not completely transparent and includes a small amount of fluorescent substance as long as the fluorescent substance is dispersed with no intention of converting the wavelength of light within the transparent light-guiding member 22.

The transparent member 42 is made of a highly transparent organic or inorganic material, such as a polyester resin or glass. Although the transparent member 42 is made of a highly transparent material not including a fluorescent substance, the transparent member 42 may be made of a material that is not completely transparent and includes a small amount of fluorescent substance as long as the fluorescent substance is dispersed with no intention of converting the wavelength of light within the transparent member 42. Although the transparent member 42 is formed into, for example, a transparent film member, an inflexible plate member, such as glass, may be used as the transparent member 42.

Part of the external light beam L1 incident from the first main surface 42A of the transparent member 42 is absorbed by the first fluorescent substance 81 dispersed within the first adhesive layer 43, and converted into first light beams L2. The first light beams L2 emitted from the first fluorescent substance 81 propagate through the transparent light-guiding member 22 while being totally reflected by the transparent light-guiding member 22 and are incident on the second adhesive layers 44, 45, 46, and 47 (only the second adhesive layers 44 and 46 are illustrated in FIG. 13). Then, the first light beams L2 are absorbed by the second fluorescent substance 83 dispersed within the second adhesive layers 44, 45, 46, and 47 and are converted into second light beams L3. The second light beams L3 are finally incident on the solar cells 14, 15, 16, and 17 (only the solar cells 14 and 16 are illustrated in FIG. 13).

In the solar cell module 4, the transparent member 42, the first adhesive layer 43, and the transparent light-guiding member 22 function as a light guiding portion 48 that absorbs part of the external light beam L1 using the first fluorescent substance 81 and transmits the first light beams L2 emitted from the first fluorescent substance 81 toward the solar cells 14, 15, 16, and 17.

The second adhesive layers 44, 45, 46, and 47 function as converters 49 that absorb the first light beams L2 incident on the second adhesive layers 44, 45, 46, and 47 from the light guiding portion 48 using the second fluorescent substance 83 and cause the second light beams L3 emitted from the second fluorescent substance 83 to be incident on the solar cells 14, 15, 16, and 17.

In the solar cell module 4, the light guiding portion 48 includes the transparent member 42, the first adhesive layer 43, and the transparent light-guiding member 22. Thus, the first light beam L2 emitted from the first adhesive layer 43 propagates through the transparent light-guiding member 22 without being absorbed by the first fluorescent substance. For example, in the solar cell module 1 according to the first embodiment, part of the first light beams L2 propagating through the light guiding portion 12 is absorbed by the first fluorescent substance 71 dispersed within the light guiding portion 12, resulting in a loss of light. On the other hand, in the solar cell module 4 according to the fourth embodiment, the amount of loss due to self absorption is reduced and almost the entirety of the first light beams L2 emitted from the first adhesive layer 43 is incident on the converters 49. Thus, the solar cell module 4 that highly efficiently generates power is provided.

In the solar cell module 4, the second adhesive layers 44, 45, 46, and 47 within which the second fluorescent substance 83 is dispersed and that bond the transparent light-guiding member 22 and the solar cells 14, 15, 16, and 17 together are used as the converters 49. Thus, compared with the case where second light-guiding members 24, 25, 26, 27 are additionally provided as the converters 29, as in the solar cell module 2 according to the second embodiment, the number of components can be reduced. In addition, the solar cell module 4 can dispense with adhesive layers used to bond the second light-guiding members 24, 25, 26, 27 and the transparent light-guiding member 22 together, thereby eliminating loss of light due to this adhesive layers and increasing the efficiency in generating power. Further, since the thickness of the second adhesive layers 44, 45, 46, and 47 is smaller than that of the second light-guiding members 24, 25, 26, and 27, the amount of use of the second fluorescent substances can be made smaller than that in the case where the second fluorescent substance is dispersed within the second light-guiding members 24, 25, 26, and 27. Consequently, the cost of components can be reduced.

Fifth Embodiment

Figure 14:
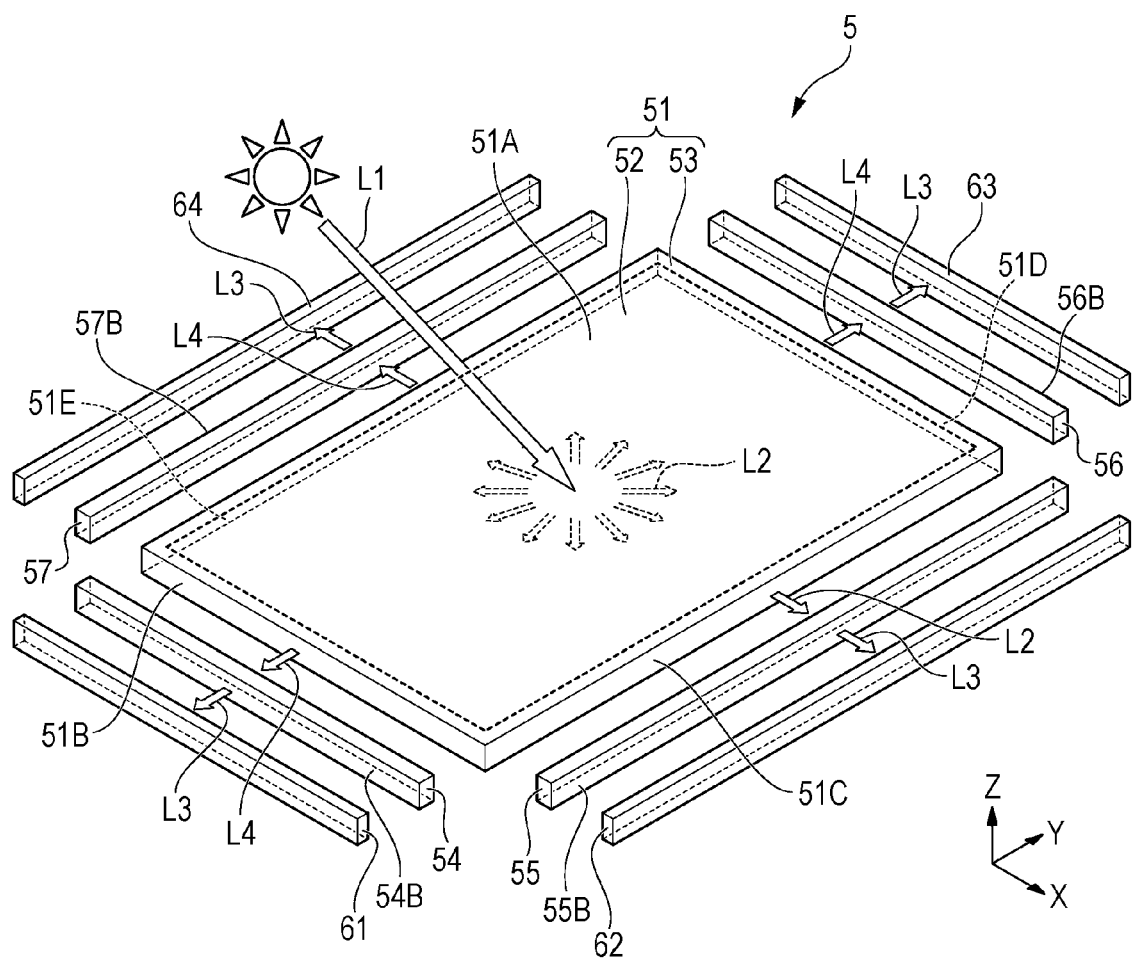
FIG. 14 is an exploded perspective view of a solar cell module according to a fifth embodiment.

FIG. 14 is an exploded perspective view of a solar cell module 5 according to a fifth embodiment. In the solar cell module 5, components that are the same as those of the solar cell module 1 according to the first embodiment are denoted by the same reference symbols and are not described in detail.

The solar cell module 5 includes a fluorescent light-guiding member 51, multiple fluorescent light-guiding members 54, 55, 56, and 57 disposed on end faces 51B, 51C, 51D, and 51E of the fluorescent light-guiding member 51, and multiple solar cells 61, 62, 63, and 64 that receive light beams L3 emitted from end faces 54B, 55B, 56B, and 57B of the fluorescent light-guiding members 54, 55, 56, and 57.

The fluorescent light-guiding member 51 is a substantially rectangular plate member having a first main surface 51A that is perpendicular to the Z axis (parallel to the XY plane). The fluorescent light-guiding member 51 includes a light guiding portion 52, within which a first fluorescent substance is dispersed, and a first converter 53, within which a second fluorescent substance is dispersed. The light guiding portion 52 is positioned at a central area of the fluorescent light-guiding member 51 while the first converter 53 surrounds the outer periphery of the light guiding portion 52 and forms a rectangular frame along the four end faces 51B, 51C, 51D, and 51E of the fluorescent light-guiding member 51.

A portion of the first main surface 51A of the fluorescent light-guiding member 51 that overlaps the light guiding portion 52 is a light-incident surface and the four end faces 51B, 51C, 51D, and 51E of the fluorescent light-guiding member 51 are light-emergent surfaces.

The light guiding portion 52 converts part of the external light beam L1 (sunlight, for example) incident on the first main surface 51A into first light beams L2 using the first fluorescent substance and transmits the first light beams L2 toward the end faces 51B, 51C, 51D, and 51E. The first converter 53 converts the first light beams L2 incident from the light guiding portion 52 into third light beams L4 using a second fluorescent substance and emits the third light beams L4 from the end faces 51B, 51C, 51D, and 51E.

Bar-shaped fluorescent light-guiding members 54, 55, 56, and 57 that respectively extend along the four end faces 51B, 51C, 51D, and 51E of the fluorescent light-guiding member 51 are bonded to the end faces 51B, 51C, 51D, and 51E. A third fluorescent substance is dispersed within each of the fluorescent light-guiding members 54, 55, 56, and 57. The fluorescent light-guiding members 54, 55, 56, and 57 are second converters that convert, using the third fluorescent substance, the third light beams L4 incident from the end faces 51B, 51C, 51D, and 51E of the fluorescent light-guiding member 51 into second light beams L3 and that emit the second light beams L3 from the end faces 54B, 55B, 56B, and 57B, the solar cells 61, 62, 63, and 64 having higher spectral sensitivity to the second light beams L3 than to the first light beams L2.

The solar cells 61, 62, 63, and 64 are disposed on end faces 54B, 55B, 56B, and 57B of the fluorescent light-guiding members 54, 55, 56, and 57. Light receiving surfaces of the solar cells 14, 15, 16, and 17 face the end faces 54B, 55B, 56B, and 57B of the fluorescent light-guiding members 54, 55, 56, and 57 and the solar cells 14, 15, 16, and 17 are bonded to the end faces 54B, 55B, 56B, and 57B of the fluorescent light-guiding members 54, 55, 56, and 57.

Figure 15:
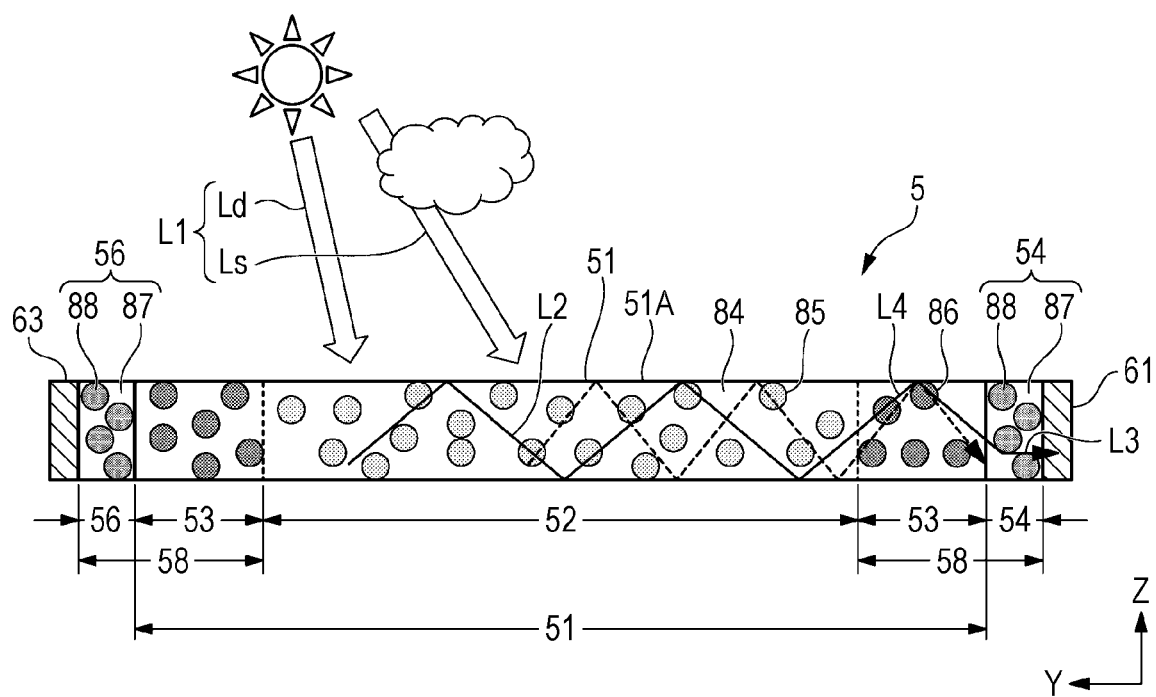
FIG. 15 is a cross sectional view of the solar cell module according to the fifth embodiment.

FIG. 15 is a cross sectional view of the solar cell module 5.

A first fluorescent substance 85 is dispersed in a center portion of the fluorescent light-guiding member 51, the first fluorescent substance 85 absorbing ultraviolet light or visible light included in the external light beam L1 and emitting a first light beam L1 including visible light or infrared light. A second fluorescent substance 86 is dispersed in an outer peripheral portion of the fluorescent light-guiding member 51, the second fluorescent substance 86 absorbing visible light or infrared light included in the first light beam L2 and emitting a third light beam L4 including visible light or infrared light.

As an example of the first fluorescent substance 85, a fluorescent substance Lumogen F Violet 570 (trade name) manufactured by BASF SE having an emission spectrum with a peak wavelength at 413 nm is used. As an example of the second fluorescent substance 86, a fluorescent substance Lumogen F Yellow 170 (trade name) manufactured by BASF SE having an emission spectrum with a peak wavelength at 528 nm is used.

A portion of the fluorescent light-guiding member 51 within which the first fluorescent substance 85 is dispersed is the light guiding portion 52 and a portion of the fluorescent light-guiding member 51 within which the second fluorescent substance 86 is dispersed is the first converter 53. The light guiding portion 52 and the first converter 53 are formed by respectively dispersing different types of fluorescent substances 85 and 86 within different regions of a transparent light-guiding member 84 made of a highly transparent organic or inorganic material, such as an acrylic resin, polycarbonate resin, or glass.

The fluorescent light-guiding members 54, 55, 56, and 57 (only the fluorescent light-guiding members 54 and 56 are illustrated in FIG. 15), which serve as second converters, are bonded to end faces of the fluorescent light-guiding member 51.

The fluorescent light-guiding members 54, 55, 56, and 57 are each obtained by dispersing a third fluorescent substance 88 within a bar-shaped transparent light-guiding member 87 made of a highly transparent organic or inorganic material, such as an acrylic resin, polycarbonate resin, or glass, the third fluorescent substance 88 absorbing visible light or infrared light included in the third light beam L4 and emitting a second light beam L3 including visible light or infrared light. As an example of the third fluorescent substance 88, a fluorescent substance Lumogen F Orange 240 (trade name) manufactured by BASF SE having an emission spectrum with a peak wavelength at 539 nm is used.

The first converter 53 and the fluorescent light-guiding members 54, 55, 56, and 57, which serve as second converters, form a converter 58 that converts the first light beams L2 incident from the light guiding portion 52 into second light beams L3 to which the solar cells 61, 62, 63, and 64 have higher spectral sensitivity than to the first light beams L2 and causes the second light beams L3 to be incident on the solar cells 61, 62, 63, and 64.

The first converter 53 and the second converters (fluorescent light-guiding members 54, 55, 56, and 57) constituting the converter 58 are arranged in order from the light guiding portion 52 side toward the solar cell 61, 62, 63, and 64 side such that those including a dispersing fluorescent substance 86 or 88 having an emission spectrum with a smaller peak wavelength are disposed closer to the light guiding portion 52 and those including a dispersing fluorescent substance 86 or 88 having an emission spectrum with a larger peak wavelength are disposed closer to the solar cells 61, 62, 63, and 64. Thus, the first light beam L2 incident on the converter 58 is converted stepwise by different types of fluorescent substances 86 and 88 into the second light beam L3.

Amorphous silicon solar cells that have high spectral sensitivity to the light beam L3 emitted from the third fluorescent substance 88 are used as the solar cells 61, 62, 63, and 64.

Part of the external light beam L1 incident on the fluorescent light-guiding member 51 from the first main surface 51A of the fluorescent light-guiding member 51 is absorbed by the first fluorescent substance 85, dispersed within the light guiding portion 52, and converted into the first light beams L2. The first light beams L2 emitted from the first fluorescent substance 85 propagate through the light guiding portion 52 while being totally reflected by the light guiding portion 52 and are incident on the first converter 53. Then, the first light beams L2 are absorbed by the second fluorescent substance 86, dispersed within the first converter 53, and converted into the third light beams L4. The third light beams L4 are then incident on the fluorescent light-guiding members 54, 55, 56, and 57. The third light beams L4 are absorbed by the second fluorescent substance 88, dispersed within the fluorescent light-guiding members 54, 55, 56, and 57, and converted into the second light beams L3. The second light beams L3 are then incident on the solar cells 61, 62, 63, and 64.

Figure 16:
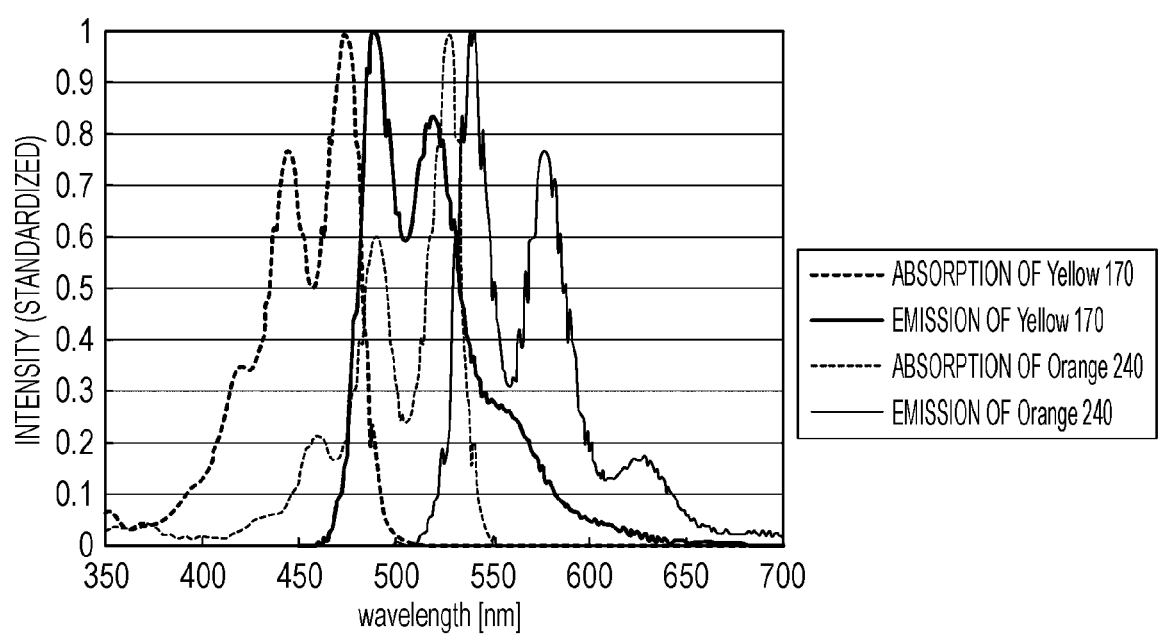
FIG. 16 illustrates absorption spectrums and emission spectrums of fluorescent substances.

FIG. 16 illustrates absorption spectrums and emission spectrums of the second fluorescent substance 86 (Lumogen F Yellow 170 (trade name) manufactured by BASF SE) and the third fluorescent substance 88 (Lumogen F Orange 240 (trade name) manufactured by BASF SE) included in the converter.

In the example of FIG. 16, the second fluorescent substance 86 converts light ranging from 420 nm to 470 nm to light having a wavelength ranging from 470 nm to 570 nm while the third fluorescent substance 88 converts light having a wavelength ranging from 470 n to 530 nm into light having a wavelength ranging from 570 nm to 650 nm. The wavelength range of light emitted by the second fluorescent substance 86 at a high intensity generally coincides with a wavelength range of light absorbed by the third fluorescent substance 88 at a high intensity. Thus, the light emitted by the second fluorescent substance 86 is efficiently absorbed by the third fluorescent substance 88 and then converted into light having a longer wavelength.

Although FIG. 16 illustrates the case where the wavelength is converted in two steps by using two different types of fluorescent substances, the wavelength is similarly converted in three or more steps by using three or more different types of fluorescent substances. The wavelength of light can be converted in multiple steps by using multiple types of fluorescent substances that emit light having wavelengths slightly different from one another such that the wavelength of light absorbed by one fluorescent substance overlaps the wavelength of light emitted by a subsequent fluorescent substance. When the wavelength is converted in multiple steps by using multiple types of fluorescent substances, the wavelength can be converted to a larger extent than in the case where the wavelength is converted by using only one type of fluorescent substance.

As described above, in the solar cell module 5, the first light beam L2 incident on the converter 58 is converted into the second light beam L3 stepwise by using multiple different types of fluorescent substances 86 and 88. Thus, the wavelength of the second light beam L3 can be controlled in a wide wavelength range. Consequently, the solar cells 61, 62, 63, and 64 can be selected from a wide range of solar cells, thereby increasing the efficiency in generating power.

[Modifications]

As in the case of the solar cell module 3, reflective layers that reflect the second light beam L3 may be disposed on the surfaces of the converter other than the surfaces that face the solar cells in each of the solar cell modules 1, 2, and 5.

As in the case of the solar cell module 5, the converter may contain multiple types of fluorescent substances in each of the solar cell modules 1, 2, 3, and 4 so that the first light beam L2 incident on the converter is converted into the second light beam L3 stepwise by using the multiple types of fluorescent substances.

In each of the solar cell modules 1, 2, 3, 4, and 5, the solar cells are disposed on the four end faces of the light-guiding member. However, it is only required that a solar cell be disposed on at least one end face of the light-guiding member. In this case, it is preferable that reflective layers be disposed on end faces of the light-guiding member to which solar cells are not disposed in order to prevent light from leaking out from the end faces.

In each of the solar cell modules 1, 2, 3, 4, and 5, Lumogen F Red 305 (trade name), NILE BLUE A Perchlorate (CAS registry No. 3625-57-8), Lumogen F Violet 570 (trade name), Lumogen F Yellow 170 (trade name), and Lumogen F Orange 240 (trade name) are used as preferable examples of fluorescent substances. However, fluorescent substances are not limited to these examples. In addition, the materials of the solar cell to be used are not limited to those described in the embodiments. Examples of preferable combinations of a material of a fluorescent substance that emits the second light beam L3 and a material of a solar cell are illustrated as follows, where the left side indicates the material of the fluorescent substance and the right side indicates the preferable material of the solar cell.

(1) Lumogen f Yellow 083 (trade name, manufactured by BASF SE) and an amorphous silicon solar cell, (2) Lumogen F Yellow 170 (trade name, manufactured by BASF SE) and an amorphous silicon solar cell, (3) Lumogen F Red 305 (trade name, manufactured by BASF SE) and a polycrystalline silicon solar cell, and (4) Lumogen F Violet 570 (trade name, manufactured by BASF SE) and a dye sensitized solar cell.

[Solar Generator]

Figure 17:
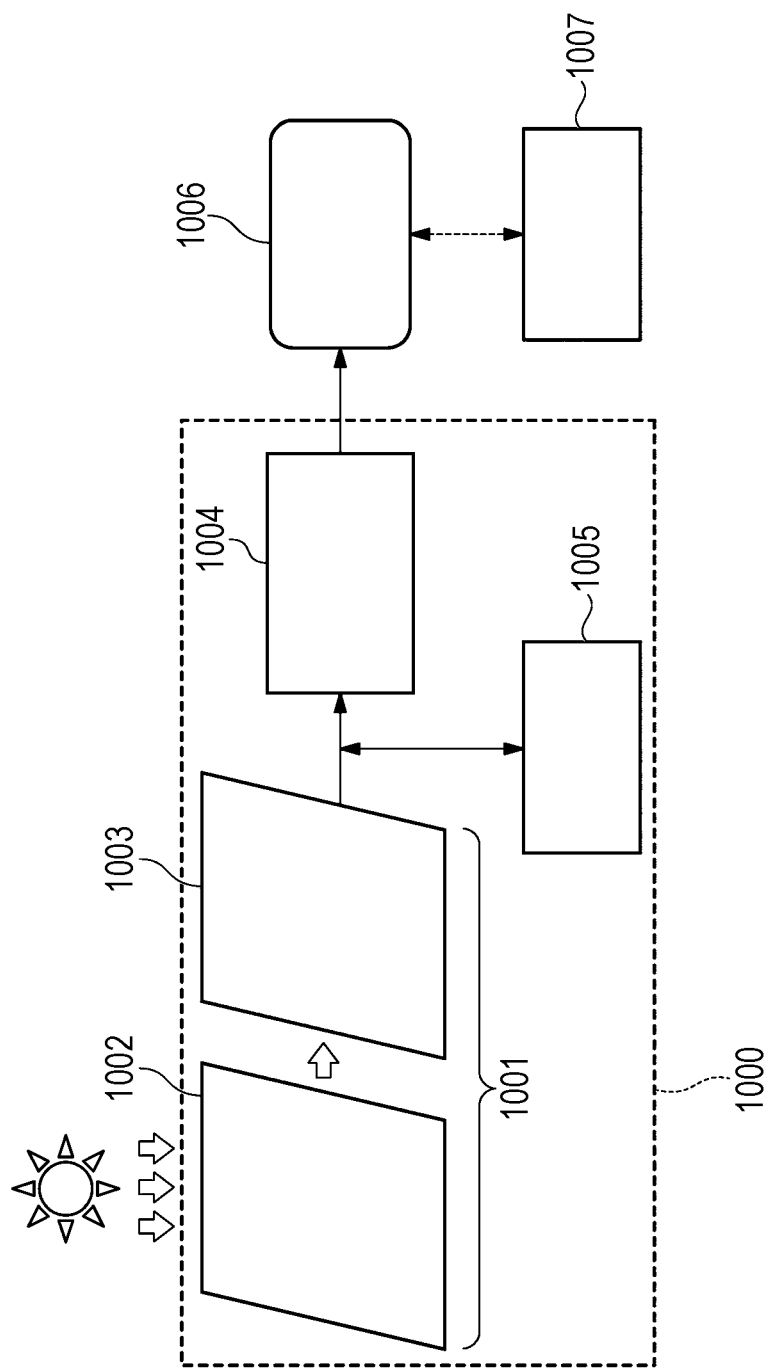
FIG. 17 is a block diagram of a solar generator.

FIG. 17 is a block diagram of a solar generator 1000.

The solar generator 1000 includes a solar cell module 1001 that converts energy of sunlight into power, an inverter (direct current-to-alternating current converter) 1004 that converts the direct current output from the solar cell module 1001 into the alternating current, and a storage battery 1005 that stores the direct current output from the solar cell module 1001.

The solar cell module 1001 includes a light-guiding member 1002 that collects sunlight and a solar cell 1003 that generates power using the sunlight collected by the light-guiding member 1002.

Any one of the above-described solar cell modules 1, 2, 3, 4, and 5 according to the first to fifth embodiments is used as an example of the solar cell module 1001.

The solar generator 1000 supplies power to an external electric device 1006. Power is supplied to the electric device 1006 from a subsidiary power source 1007 as needed.

Since the solar generator 1000 is a solar generator that highly efficiently generates power since the system 1000 includes the above-described solar cell module according to the present invention.

INDUSTRIAL APPLICABILITY

An aspect of the present invention is applicable to a solar cell module and a solar generator.

REFERENCE SIGNS LIST 1, 2, 3, 4, 5 solar cell module
11 fluorescent light-guiding member
12 light guiding portion
13 converter
14, 15, 16, 17 solar cell
22 transparent light-guiding member
23 fluorescent film (fluorescent layer)
24, 25, 26, 27 fluorescent light-guiding member
28 light guiding portion
29 converter
31 fluorescent light-guiding member
32 light guiding portion
33 converter
34, 35, 36, 37 solar cell
38, 39 reflecting layer
42 transparent member
43 first adhesive layer (fluorescent layer)
44, 45, 46, 47 second adhesive layer
48 light guiding portion
49 converter
51 fluorescent light-guiding member
52 light guiding portion
53 first converter
54, 55, 56, 57 fluorescent light-guiding member (second converter)
58 converter
61, 62, 63, 64 solar cell
70 transparent light-guiding member
71 first fluorescent substance
72 second fluorescent substance
73 transparent film
74 first fluorescent substance
75 transparent light-guiding member
76 second fluorescent substance
77 transparent light-guiding member
78 first fluorescent substance
79 second fluorescent substance
80 transparent resin
81 first fluorescent substance
82 transparent resin
83 second fluorescent substance
84 transparent light-guiding member
85 first fluorescent substance
86 second fluorescent substance
87 transparent light-guiding member
88 third fluorescent substance
1000 solar generator
1001 solar cell module
L1 external light beam
L2 first light beam
L3 second light beam
L4 third light beam

The invention claimed is:

1. A solar cell module comprising:
a solar cell;
a light guiding portion including a first fluorescent substance, the light guiding portion absorbing part of incident light using the first fluorescent substance and transmitting a first light beam emitted from the first fluorescent substance toward the solar cell; and
a converter disposed between the light guiding portion and the solar cell, the converter converting the first light beam incident from the light guiding portion into a second light beam and causing the second light beam to be incident on the solar cell, the solar cell having higher spectral sensitivity to the second light beam than to the first light beam, wherein
the light guiding portion is formed by dispersing the first fluorescent substance within a center portion of a transparent light-guiding member, and
the converter is formed by dispersing a second fluorescent substance only within an outer peripheral portion of the transparent light-guiding member, the second fluorescent substance absorbing the first light beam and emitting the second light beam.

2. The solar cell module according to claim 1, wherein the converter includes a plurality of types of fluorescent substances, and the first light beam incident on the converter is converted into the second light beam stepwise using the plurality of types of fluorescent substances.

3. The solar cell module according to claim 1, wherein reflective layers that reflect the second light beam are disposed on surfaces of the converter other than a surface that faces the solar cell.

4. A solar generator comprising the solar cell module according to claim 1.

5. A solar cell module comprising:
a transparent light-guiding member;
a first fluorescent substance dispersed within a center portion of the transparent light-guiding member; and
a second fluorescent substance dispersed only within an outer peripheral portion of the transparent light-guiding member, the second fluorescent substance having a first emission spectrum peak at a first wavelength range, the first emission spectrum peak being longer than a second emission spectrum peak, the first fluorescent substance having the second emission spectrum peak.

6. The solar cell module according to claim 5, wherein the first wavelength range is from 600 nm to 900 nm.

\* \* \* \* \*